(12) United States Patent
Kato

(10) Patent No.: US 6,401,542 B1
(45) Date of Patent: Jun. 11, 2002

(54) PRESSURE SENSING SEMICONDUCTOR DEVICE COMPRISING A SEMICONDUCTOR CHIP WHICH HAS A DIAPHRAGM FORMED WITH PIEZORESISTANCE

(75) Inventor: Hajime Kato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 22 days.

(21) Appl. No.: 09/614,211

(22) Filed: Jul. 11, 2000

(30) Foreign Application Priority Data

Jan. 24, 2000 (JP) ........................................ 2000-014450

(51) Int. Cl.[7] ................................................ G01L 9/06
(52) U.S. Cl. ...................................................... 73/721
(58) Field of Search ........................... 73/715, 716, 717, 73/718, 719, 720, 721–727, 754, 756; 257/414, 415, 417, 418, 420; 438/50, 51

(56) References Cited

U.S. PATENT DOCUMENTS 4,079,508 A * 3/1978 Nunn .............................. 29/580
6,003,381 A * 12/1999 Kato .............................. 73/721
6,066,882 A * 5/2000 Kato .............................. 257/414

FOREIGN PATENT DOCUMENTS

JP         10-209469         8/1998

\* cited by examiner

*Primary Examiner*—William Oen
(74) *Attorney, Agent, or Firm*—Oblon, Spivak, McClelland, Maier & Neustadt, P.C.

(57) ABSTRACT

A down-sized pressure sensing semiconductor device with improved EMI tolerance as compared with conventional ones is achieved. A metal substrate (11) has a through hole (12), in which a cylinder (9b) of a pressure leading-in tube (9) is inserted, and is fixed to a flange (9a) of the pressure leading-in tube (9). A control circuit component (13) for controlling a semiconductor chip (1) is disposed on the metal substrate (11). On the metal substrate (11), a connector electrode (14) is further provided which establishes electrical connections between the pressure sensing semiconductor device and external circuits. Further, a metal cover (17) in the shape of a connector leading to external circuits is soldered to the metal substrate (11) to cover the semiconductor chip (1) and the control circuit component (13) together with the metal substrate (11). The cover (17) is electrically connected to a conductive wire (e.g., a ground wire) formed on the metal substrate (11).

11 Claims, 4 Drawing Sheets

US 6,401,542 B1

PRESSURE SENSING SEMICONDUCTOR DEVICE COMPRISING A SEMICONDUCTOR CHIP WHICH HAS A DIAPHRAGM FORMED WITH PIEZORESISTANCE

BACKGROUND OF THE INVENTION

1. Field of the Invention

The present invention relates to a pressure sensing semiconductor device comprising a semiconductor chip which has a diaphragm formed with piezoresistance.

2. Description of the Background Art

FIG. 6 is a cross-sectional view showing the structure of a pressure sensing element 50 for use in conventional pressure sensing semiconductor devices. A semiconductor chip 101 includes a supporting part 101a and a diaphragm 101b. Piezoresistance 102 is located in the upper surface of the diaphragm 101b and surface electrode 103 are located on the upper surface of the supporting part 101a.

The supporting part 101a of the semiconductor chip 101 is fixed on the upper surface of a seating 104. The seating 104 has a through hole 105 formed under the diaphragm 101b and is fixed on a metal package 106. The metal package 106 has a through hole 107 leading to the through hole 105 in the seating 104. On the rear surface of the metal package 106, a pressure leading-in tube 108 is provided which defines a through hole 113 leading to the through hole 107 in the metal package 106. The metal package 106 also has leads 109 which are electrically connected by fine Au wires 110 to the surface electrodes 103 on the semiconductor chip 101. The upper surface of the semiconductor chip 101 is coated with a moisture-proof resin 112 to cover the surface electrodes 103 and the Au wires 110. Further, a metal cap 111 is welded to the metal package 106 to cover the semiconductor chip 101 together with the metal package 106.

Although the pressure sensing element 50 shown in FIG. 6 is a pressure sensor designed to detect absolute pressure, it may be a pressure sensor designed to detect pressure relative to atmospheric pressure by forming holes to open up atmosphere in the metal cap 111.

FIG. 7 is a cross-sectional view showing the structure of a conventional pressure sensing semiconductor device. The pressure sensing element 50 shown in FIG. 6 is mounted on a printed circuit board 120. A control circuit component 121 for controlling the semiconductor chip 101 is further mounted on the printed circuit board 120 together with other circuit components such as a capacitor and a chip resistor. Further, a connector electrode 122 is soldered onto the printed circuit board 120 to establish electrical connections between the pressure sensing semiconductor device and external circuits. The control circuit component 121 and the connector electrode 122 are electrically connected to the leads 109 in the pressure sensing element 50. Also, a metal shielding case 123 is soldered onto the printed circuit board 120 to cover the pressure sensing element 50. The printed circuit board 120 and the metal shielding case 123 are surrounded by resin cases 124, 125 in the shape of connectors leading to external circuits.

Since such a conventional pressure sensing semiconductor device requires, in addition to the pressure sensing element 50, the printed circuit board 120, the metal shielding case 123, the resin cases 124, 125, and the like, it was difficult to do miniaturization of the device and to simplify the assembling process.

In addition, a limited space between the rear surface of the printed circuit board 120 and the resin case 125 prevents another metal shielding case 123 from being provided on the rear surface side of the printed circuit board 120, and therefore especially the control circuit component 121 has low EMI tolerance.

SUMMARY OF THE INVENTION

A first aspect of the present invention is directed to a pressure sensing semiconductor device comprising: a semiconductor chip having a diaphragm formed with piezoresistance; a seating having a first main surface to which the semiconductor chip is fixed and in which a through hole is located at a point facing the diaphragm; a pressure leading-in tube of metal having a cylinder leading to the through hole in the seating and a flange having a first main surface fixed to a second main surface of the seating on the opposite side of the first main surface of the seating; and a metal substrate having a through hole in which the cylinder is inserted and a control circuit electrically connected to the semiconductor chip, the metal substrate being jointed to the flange by welding.

A second aspect of the present invention is directed to a pressure sensing semiconductor device comprising: a semiconductor chip having a diaphragm formed with piezoresistance; a seating having a first main surface to which the semiconductor chip is fixed and in which a through hole is located at a point facing the diaphragm; a pressure leading-in tube of metal having a cylinder leading to the through hole in the seating and a flange having a first main surface fixed to a second main surface of the seating on the opposite side of the first main surface of the seating; and a metal substrate having a through hole in which the cylinder is inserted, a control circuit electrically connected to the semiconductor chip, and a conductive pattern formed on a main surface facing the flange, the metal substrate being jointed to the flange by soldering the conductive pattern to a second main surface of the flange on the opposite side of the first main surface of the flange.

According to a third aspect of the present invention, in the device of the second aspect, at least either of the second main surface of the flange and a surface of the conductive pattern is plated to improve joint adhesion.

According to a fourth aspect of the present invention, the device of either of the first to third aspects further comprises: a metal cover fixed on the metal substrate to cover the semiconductor chip and the control circuit together with the metal substrate.

According to a fifth aspect of the present invention, the device of either of the first to fourth aspects further comprises: a glass cap fixed on the semiconductor chip and having a closed chamber to form a pressure standardized chamber on the diaphragm.

According to a sixth aspect of the present invention, in the device of either of the first to fifth aspects, the metal substrate further includes: a mounting part for mounting the pressure sensing semiconductor device to a target; and a connector electrode for establishing electrical connections between the pressure sensing semiconductor device and an external circuit.

A seventh aspect of the present invention is directed to a pressure sensing semiconductor device comprising: a semiconductor chip having a diaphragm formed with piezoresistance; a seating which has a through hole facing the diaphragm and to which the semiconductor chip is fixed; a pressure leading-in tube leading to the through hole; a substrate having a control circuit electrically connected to the semiconductor chip; and a glass cap disposed on the semiconductor chip and having a closed chamber to form a pressure standardized chamber on the diaphragm.

In accordance with the first aspect, the device can be miniaturized since none of the conventional metal package and resin cases is required.

In accordance with the second aspect, the device can be miniaturized since none of the conventional metal package and resin cases is required.

The device of the third aspect can improve joint adhesion of the metal substrate to the flange.

The device of the fourth aspect can improve EMI tolerance since the cover and the metal substrate are at the same potential.

The device of the fifth aspect permits single wafer processing in forming the glass cap, thereby improving productivity.

In accordance with the sixth aspect, the device can further be miniaturized.

The device of the seventh aspect permits single wafer processing in forming the glass cap, thereby improving productivity.

An object of the present invention is to provide a downsized pressure sensing semiconductor device with improved EMI tolerance as compared with conventional ones.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
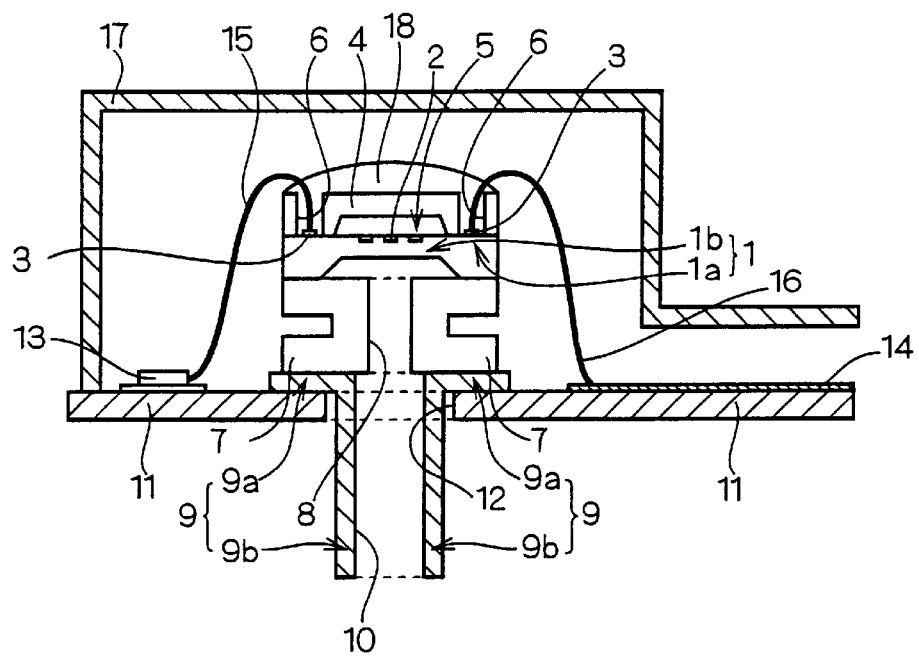
FIG. 1 is a cross-sectional view showing the structure of a pressure sensing semiconductor device according to a preferred embodiment of the present invention.

FIG. 1 is a cross-sectional view showing the structure of a pressure sensing semiconductor device according to a preferred embodiment of the present invention. A semiconductor chip 1 includes a diaphragm 1b which is formed by etching the central part of a silicon substrate a predetermined film thickness from the rear surface side, and a supporting part 1a to support the diaphragm 1b. Piezoresistance 2 is located in the upper surface of the diaphragm 1b and surface electrodes 3 are located on the upper surface of the supporting part 1a.

On the semiconductor chip 1, a glass cap 4 is securely disposed by anodic bonding. The glass cap 4 is formed with a closed chamber 5 to form a pressure standardized chamber on the diaphragm 1b. The closed chamber 5 is kept under vacuum. The glass cap 4 has through holes 6 located at the points corresponding to the surface electrodes 3. In Japanese Patent Laid-open No. P10-209469A, there is described a pressure sensing semiconductor device wherein a reference-pressure leading-in tube for applying reference pressure from the outside to a diaphragm is formed on a semiconductor chip. However, the pressure sensing semiconductor device of the present invention in FIG. 1 permits single wafer processing in forming the glass cap 4 on the semiconductor chip 1, thereby improving productivity as compared with the one described in the publication.

The supporting part 1a of the semiconductor chip 1 is fixed on the upper surface of a seating 7 for stress relaxation. The seating 7, which is formed of glass or silicon, has a through hole 8 located under the diaphragm 1b. A pressure leading-in tube 9, which is formed of metal, includes a cylinder 9b which defines a through hole 10 leading to the through hole 8 in the seating 7, and a flange 9a with its upper surface fixed to the bottom of the seating 7. The pressure leading-in tube 9 is prepared by planarizing one end of a cylindrical metallic pipe to form the flange. The semiconductor chip 1 and the seating 7 are joined to each other by die bonding of an Au/Si diffusion method or soldering. Similarly, the seating 7 and the flange 9a are also jointed to each other.

A metal substrate 11 has a through hole 12 through which the cylinder 9b of the pressure leading-in tube 9 is inserted. The metal substrate 11 is fixed to the flange 9a of the pressure leading-in tube 9. Further, a control circuit component 13 for controlling the semiconductor chip 1 is disposed on the metal substrate 11. The control circuit component 13 and the semiconductor chip 1 are electrically connected to each other by a fine Au wire 15 which is inserted into the through hole 6 in the glass cap 4 with its respective ends connected to the surface electrode 3 on the semiconductor chip 1 and to the control circuit component 13. On the metal substrate 1, a connector electrode 14 is further provided which establishes electrical connections between the pressure sensing semiconductor device and external circuits. The connector electrode 14 and the surface electrode 3 are electrically connected to each other by a fine Au wire 16 inserted in the through hole 6. The upper surface of the glass cap 4 is coated with a moisture-proof resin 18 to cover the surface electrodes 3 and the Au wires 15, 16. Further, a metal cover 17 in the shape of a connector leading to external circuits is soldered to the metal substrate 11 to cover the semiconductor chip 1 and the control circuit component 13 together with the metal substrate 11. The cover 17 is electrically connected to a conductive wire such as a ground wire (not shown) formed on the metal substrate 11. This allows the cover 17 and the metal substrate 11, serving also as a package, to be at the same potential, thereby improving EMI tolerance.

Figure 2:
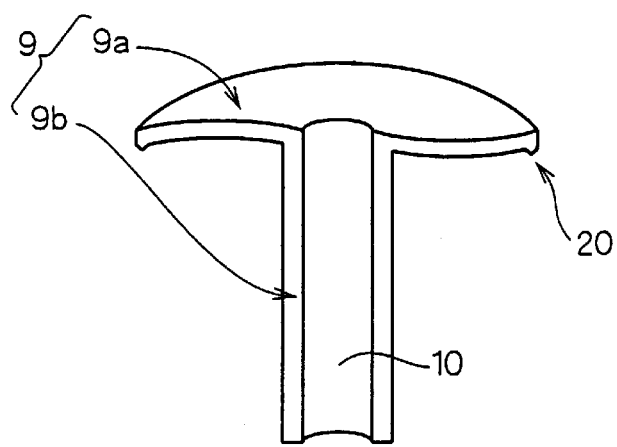
FIG. 2 is a perspective view showing part of the structure of a pressure leading-in tube.

FIG. 2 is a perspective view showing part of the structure of the pressure leading-in tube 9. On the rear surface of the flange 9a, a protrusion 20 is formed along the outer edge to increase current density in projection welding. In FIG. 1, the flange 9a and the metal substrate 11 are jointed to each other by subjecting the protrusion 20 and the metal substrate 11 to projection welding.

Figure 3:
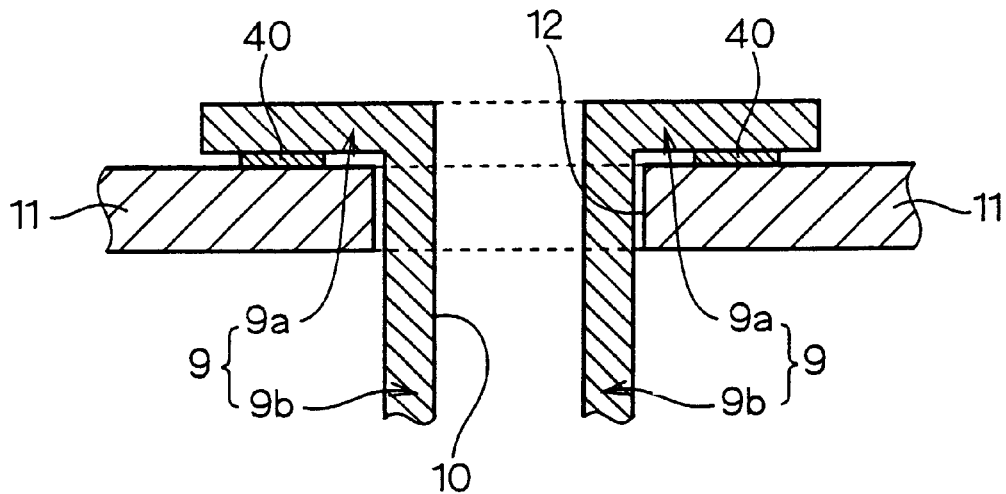
FIGS. 3 and 4 are enlarged sectional views showing the connecting part between a metal substrate and a flange.
Figure 4:
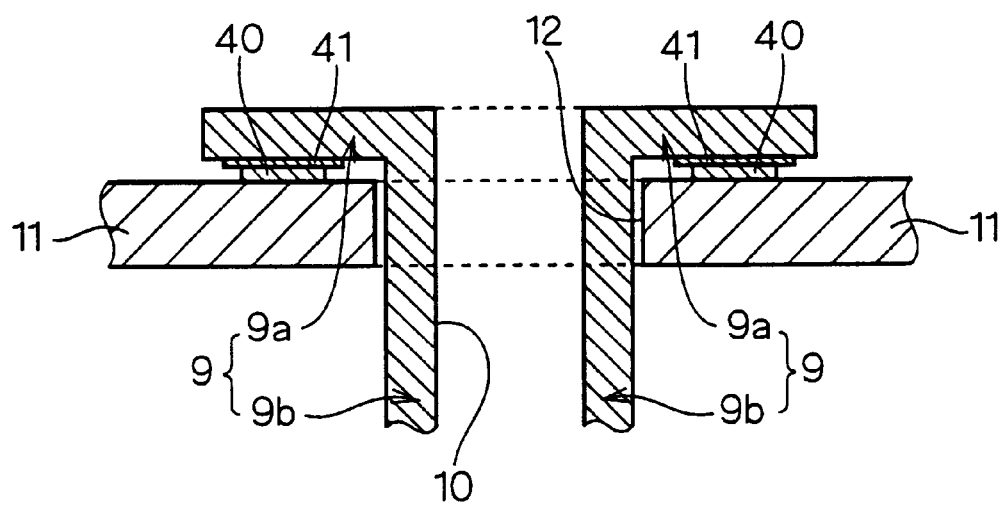

FIGS. 3 and 4 are enlarged sectional views showing the connecting part between the metal substrate 11 and the flange 9a. Instead of jointing the protrusion 20 and the metal substrate 11 by welding as above described, the flange 9a with no protrusion 20 may be soldered to a conductive pattern such as an electrode 40 or wire formed on the metal substrate 11. Even when the metal substrate 11 is formed of a metal plate with its surface covered for example with thin resins, joint adhesion of the metal substrate 11 to the flange 9a can be improved by plating the aforesaid exposed conductive pattern to make it solderable. Further, the pressure leading-in tube 9 may be formed of a material having a thermal expansion coefficient close to that of silicon (e.g., Alloy 42); in this case, as shown in FIG. 4, the rear surface of the flange 9a is plated to form a solderable metal thin film 41, which is then soldered to the electrode 40.

Figure 5:
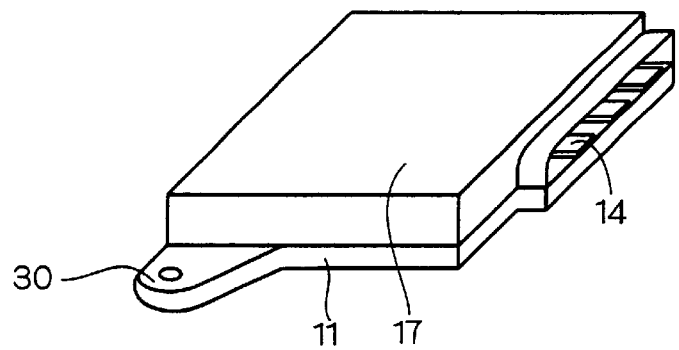
FIG. 5 is a perspective view showing the structure of the pressure sensing semiconductor device according to the preferred embodiment of the present invention.
Figure 6:
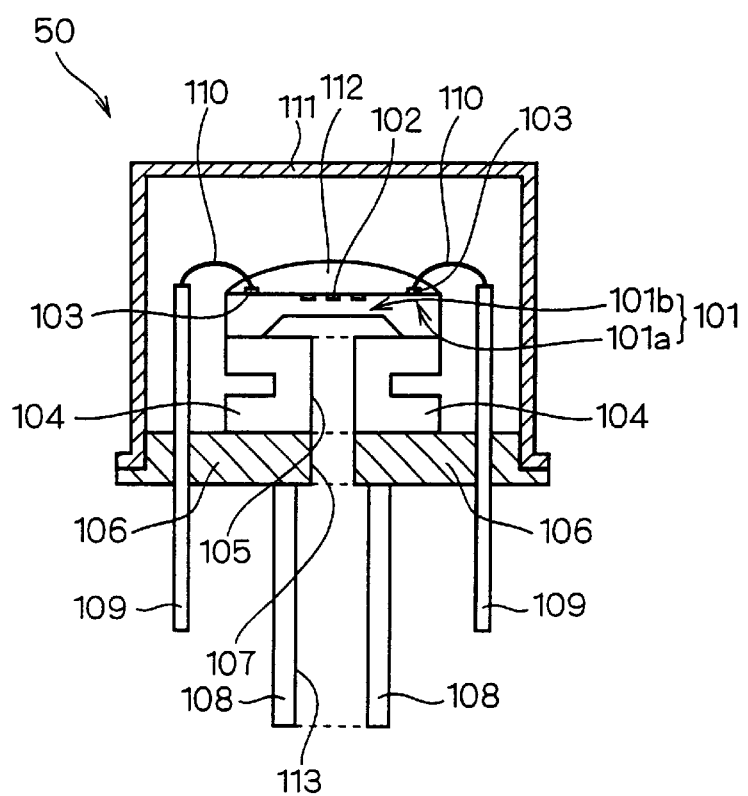
FIG. 6 is a cross-sectional view showing the structure of a pressure sensing element for use in conventional pressure sensing semiconductor devices.
Figure 7:
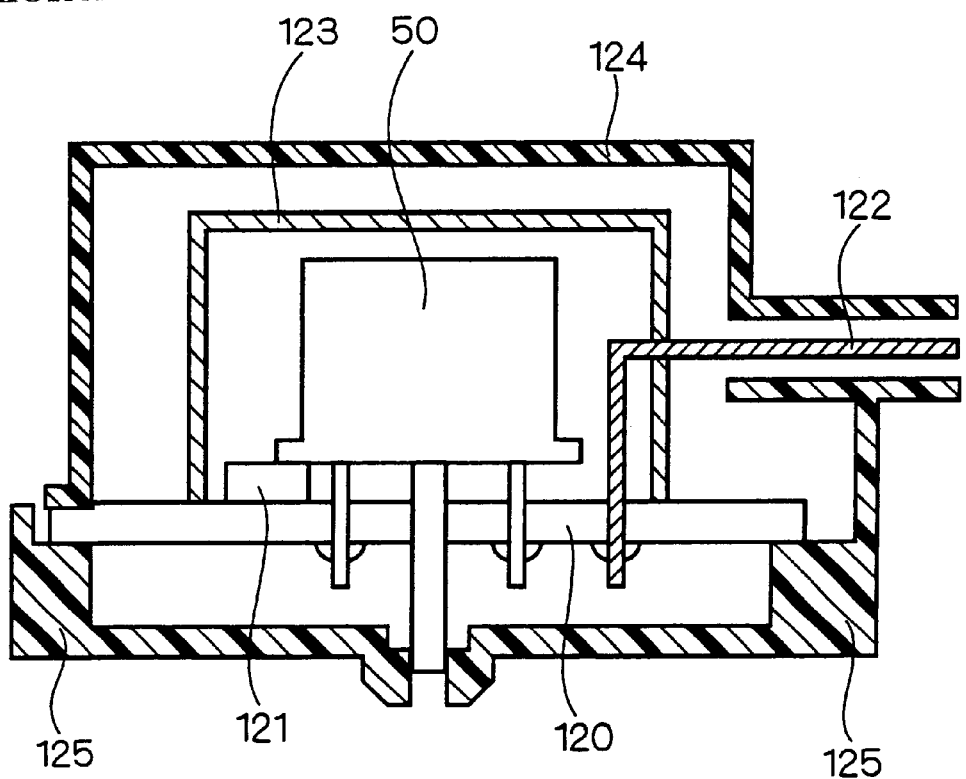
FIG. 7 is a cross-sectional view showing the structure of a conventional pressure sensing semiconductor device.

FIG. 5 is a perspective view showing the structure of the pressure sensing semiconductor device according to the preferred embodiment of the present invention. As shown in FIG. 5, the metal substrate 11 may be formed with a mounting part 30 for mounting the pressure sensing semiconductor device to a target (e.g., the body of a motor vehicle when the pressure sensing semiconductor device is used as a vehicle-mounted device). Since the connector electrode 14 is disposed on the metal substrate 11 as above described, the formation of the mounting part 30 with the metal substrate 11 eliminates the need for the conventional resin cases 124, 125 and thus reduces the size of the device.

In this way the pressure sensing semiconductor device of this embodiment can be miniaturized on the whole, since none of the conventional printed circuit board 120 and resin cases 124, 125, which are larger in size than the pressure sensing element 50, is required.

Further, the semiconductor chip 1 and the control circuit component 13 surrounded by the metal substrate 11 and the metal cover 17 improves EMI tolerance.

While the invention has been shown and described in detail, the foregoing description is in all aspects illustrative and not restrictive. It is therefore understood that numerous modifications and variations can be devised without departing from the scope of the invention.

What is claimed is:

1. A pressure sensing semiconductor device comprising:
   a semiconductor chip having a diaphragm formed with piezoresistance;
   a seating having a first main surface to which said semiconductor chip is fixed and in which a through hole is located at a point facing said diaphragm;
   a pressure leading-in tube of metal having a cylinder leading to said through hole in said seating and a flange having a first main surface fixed to a second main surface of said seating on the opposite side of said first main surface of said seating; and
   a metal substrate having a through hole in which said cylinder is inserted and a control circuit electrically connected to said semiconductor chip, said metal substrate being jointed to said flange by welding.

2. The device according to claim 1, wherein
   said pressure leading-in tube further has a protrusion formed on a second main surface of said flange on the opposite side of said first main surface of said flange.

3. The device according to claim 1, further comprising:
   a metal cover fixed on said metal substrate to cover said semiconductor chip and said control circuit together with said metal substrate.

4. The device according to claim 1, further comprising:
   a glass cap fixed on said semiconductor chip and having a closed chamber to form a pressure standardized chamber on said diaphragm.

5. The device according to claim 1, wherein
   said metal substrate further includes:
   a mounting part for mounting said pressure sensing semiconductor device to a target; and
   a connector electrode for establishing electrical connections between said pressure sensing semiconductor device and an external circuit.

6. A pressure sensing semiconductor device comprising:
   a semiconductor chip having a diaphragm formed with piezoresistance;
   a seating having a first main surface to which said semiconductor chip is fixed and in which a through hole is located at a point facing said diaphragm;
   a pressure leading-in tube of metal having a cylinder leading to said through hole in said seating and a flange having a first main surface fixed to a second main surface of said seating on the opposite side of said first main surface of said seating; and
   a metal substrate having a through hole in which said cylinder is inserted, a control circuit electrically connected to said semiconductor chip, and a conductive pattern formed on a main surface facing said flange, said metal substrate being jointed to said flange by soldering said conductive pattern to a second main surface of said flange on the opposite side of said first main surface of said flange.

7. The device according to claim 6, wherein
   at least either of said second main surface of said flange and a surface of said conductive pattern is plated to improve joint adhesion.

8. The device according to claim 6, further comprising:
   a metal cover fixed on said metal substrate to cover said semiconductor chip and said control circuit together with said metal substrate.

9. The device according to claim 6, further comprising:
   a glass cap fixed on said semiconductor chip and having a closed chamber to form a pressure standardized chamber on said diaphragm.

10. The device according to claim 6, wherein
    said metal substrate further includes:
    a mounting part for mounting said pressure sensing semiconductor device to a target; and
    a connector electrode for establishing electrical connections between said pressure sensing semiconductor device and an external circuit.

11. A pressure sensing semiconductor device comprising:
    a semiconductor chip having a diaphragm formed with piezoresistance;
    a seating which has a through hole located at a point facing said diaphragm and to which said semiconductor chip is fixed;
    a pressure leading-in tube leading to said through hole;
    a substrate having a control circuit electrically connected to said semiconductor chip; and
    a glass cap disposed on said semiconductor chip and having a closed chamber to form a pressure standardized chamber on said diaphragm.

* * * * *